United States Patent
Mende et al.

(10) Patent No.: US 9,933,456 B2
(45) Date of Patent: Apr. 3, 2018

(54) ELECTRO-OPTIC PROBE WITH MULTIPLE SENSITIVITY RANGES

(71) Applicant: Tektronix, Inc., Beaverton, OR (US)

(72) Inventors: Michael J. Mende, Portland, OR (US); Richard A. Booman, Lake Oswego, OR (US)

(73) Assignee: Tektronix, Inc., Beaverton, OR (US)

( * ) Notice: Subject to any disclaimer, the term of this patent is extended or adjusted under 35 U.S.C. 154(b) by 140 days.

(21) Appl. No.: 14/725,243

(22) Filed: May 29, 2015

(65) Prior Publication Data

US 2016/0349287 A1    Dec. 1, 2016

(51) Int. Cl.

| | |
|---|---|
| *G01R 1/07* | (2006.01) |
| *G01R 29/08* | (2006.01) |
| *G02B 6/42* | (2006.01) |
| *G02F 1/01* | (2006.01) |
| *G02F 1/035* | (2006.01) |
| *G01R 29/12* | (2006.01) |

(52) U.S. Cl.
CPC .......... *G01R 1/071* (2013.01); *G01R 29/0885* (2013.01); *G02B 6/4274* (2013.01); *G02F 1/011* (2013.01); *G02F 1/035* (2013.01); *G01R 29/12* (2013.01)

(58) Field of Classification Search
None
See application file for complete search history.

(56) References Cited

U.S. PATENT DOCUMENTS

| | | | | |
|---|---|---|---|---|
| 4,291,939 | A * | 9/1981 | Giallorenzi | G02F 1/225 359/245 |
| 5,074,631 | A * | 12/1991 | Hamano | G02F 1/0327 385/3 |
| 5,227,715 | A * | 7/1993 | Ito | G01R 15/247 250/225 |
| 5,263,102 | A | 11/1993 | Hakogi | |
| 5,969,341 | A * | 10/1999 | Ito | G01R 1/071 250/227.11 |
| 6,532,315 | B1 * | 3/2003 | Hung | G02F 1/225 385/2 |
| 7,499,603 | B1 | 3/2009 | Krawczak et al. | |
| 2003/0021509 | A1 | 1/2003 | Yap et al. | |
| 2005/0200373 | A1 | 9/2005 | Yakymyshyn et al. | |

(Continued)

OTHER PUBLICATIONS

Extended European Search Report for European Patent Application No. 16171698.0, dated Oct. 28, 2016.

*Primary Examiner* — Paresh Patel
(74) *Attorney, Agent, or Firm* — Marger Johnson; Andrew J. Harrington

(57) ABSTRACT

A test and measurement system including an electro-optical accessory with an electro-optical sensor configured to output a modulated output signal, a device under test connected to the electro-optical accessory with a variable input signal, and a processor. The electro-optical accessory includes two sets of electrodes in which a sensitivity of the first set of electrodes is different from a sensitivity of the second set of electrodes. The processor in the test and measurement system is configured to modify the modulated output signal from the electro-optical voltage accessory to reconstruct the variable input signal of the electro-optical voltage accessory that exceeds the linear input range of the optical sensor.

20 Claims, 3 Drawing Sheets

(56) References Cited

U.S. PATENT DOCUMENTS

2006/0120655 A1\* 6/2006 Walker .................. G02F 1/0123
 385/9
2012/0134619 A1 5/2012 Seki et al.

\* cited by examiner

ELECTRO-OPTIC PROBE WITH MULTIPLE SENSITIVITY RANGES

TECHNICAL FIELD

This disclosure relates generally to test and measurement systems and signal acquisition accessories, and, more particularly, to an electric-optic probe for a test and measurement system.

BACKGROUND

Electro-optical sensors may use Mach-Zehnder interferometers as a method to determine measured voltage signals of a device under test (DUT) in a test and measurement system. It is well known that electro-optic modulators are fabricated using a substrate of electro-optic material by forming an optical waveguide in the substrate and depositing thin film electrodes on the surface of the substrate. When a potential difference is established between the electrodes, an electric field is created within the electro-optic material substrate, and this influences the refractive index of the electro-optic material. Accordingly, when light is propagated through the optical waveguide, its phase and/or magnitude varies in dependence upon the magnitude of the imposed electric field, which provides a measurement mechanism for measuring electrical parameters of the DUT through the electrodes.

Voltage probes based on an electro-optic crystal sensor can be designed to have very high sensitivity and very high input impedance. Often it is desired to have multiple sensitivity ranges in a voltage probe to resolve signals of differing levels. One conventional method to provide for multiple sensitivity ranges is to add a resistive electrical attenuator in the signal path between the DUT and the sensor. The addition of the electrical attenuator in the signal path, however, may reduce the electrical performance and limit the maximum voltages due to power dissipation issues in the attenuator. Such a reduction, when being used with a very high voltage input, has the negative effect of dissipating significant amounts of power through the attenuator.

Embodiments of the invention address this and other limitations of the prior art.

SUMMARY

Certain embodiments of the disclosed technology relate to an electro-optical test component including a crystal or polymer substrate structured to change its refractive index based on application of an electric field, an optical waveguide formed in the crystal or polymer substrate and configured to carry light from a first end of the crystal or polymer substrate and output a modulated output light signal at a second end of the waveguide, a first sensing electrode formed adjacent to the optical waveguide at a first distance therefrom, and a second sensing electrode formed adjacent to the optical waveguide at a second distance therefrom. In some embodiments the second distance is different than the first distance. The sensing electrodes may be formed of a single electrode, or as a differential pair of electrodes. Applying the signal from a device under test to the first sensing electrode causes the light to modulate at a different amplitude than applying the signal from the device under test to the second sensing electrode.

In some embodiments the optical guide includes two channels, and one or more biasing electrodes are formed adjacent the second channel.

Other embodiments of the invention include a test and measurement device. In such embodiments the test and measurement device includes an optical transmitter, an electro-optical test component coupled to the optical transmitter, an optical/electrical converter coupled to an output of the electro-optical test component, and a display structured to show a visual output based on the electric signal from the optical/electrical converter. The optical/electrical converter may be structured to generate an electric signal from an optical signal received from the crystal or polymer substrate of the electro-optical test component. The electro-optical test component of the test and measurement device may include a crystal or polymer substrate structured to change its refractive index based on application of an electric field, an optical waveguide formed in the crystal or polymer substrate and configured to carry light generated by the optical transmitter from a first end of the crystal or polymer substrate and configured to output a modulated output light signal at a second end of the waveguide, a first sensing electrode formed adjacent to the optical waveguide at a first distance therefrom, and a second sensing electrode formed adjacent to the optical waveguide at a second distance therefrom, the second distance being different than the first distance.

Other embodiments of the invention include a method for measuring a variable input signal of a device under test via an electro-optical voltage accessory connected to a test and measurement instrument, in which the electro-optical voltage accessory includes an optical waveguide having a first sensing electrode disposed at a first distance therefrom, and having a second sensing electrode disposed at a second distance therefrom. The method may include receiving at the electro-optical voltage accessory the variable input signal of the device under test, selecting the first sensing electrode or the second sensing electrode of the electro-optical voltage accessory, applying the variable input signal of the device under test to the selected sensing electrode, outputting from the electro-optical voltage accessory a modulated output signal based on the variable input signal, receiving the modulated output signal from the electro-optical voltage accessory at a processor, and modifying the modulated output signal from the electro-optical voltage accessory to reconstruct the variable input signal of the electro-optical voltage accessory. In some embodiments the variable input signal may be applied differentially to the sensing electrodes. Some embodiments also include applying a biasing signal to a biasing electrode, which may also be applied differentially.

DETAILED DESCRIPTION

Figure 1:
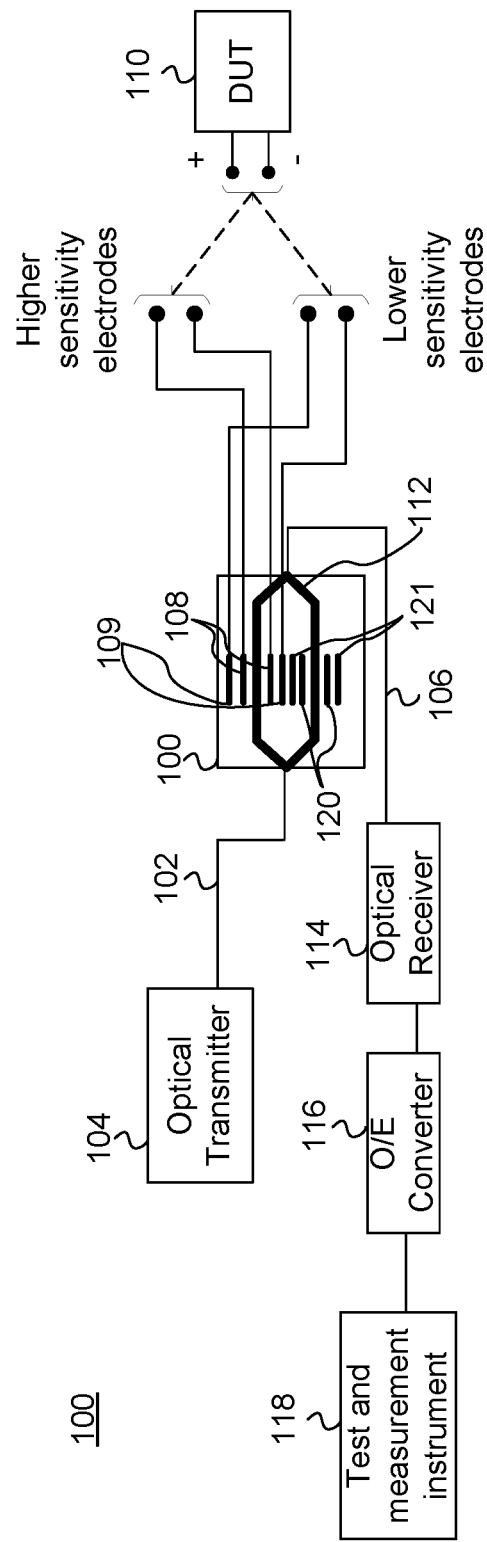
FIG. 1 illustrates an embodiment of a test and measurement system including an electro-optic device according to embodiments of the invention.

In the drawings, which are not necessarily to scale, like or corresponding elements of the disclosed systems and methods are generally denoted by the same reference numerals.

Electro-optical sensors, such as an electro-optical sensor 100 shown in FIG. 1, generally have two optical connections, an input 102 of an unmodulated light beam from an optical transmitter 104 and an output 106 that collects light that has been modulated by application of an electrical signal. The output 106 carries the modulated light to an optical receiver 114 where the modulated light may be measured.

A waveguide 112, such as a Mach-Zehnder waveguide, is formed of an electro-optic material having electrodes formed either on top of or embedded into the material. With reference to FIG. 1, four sets of electrodes are formed around and adjacent to two legs of the waveguide. Two sets of electrodes 108, 109 are connected to a DUT 110, and two sets of electrodes 120, 121 are biasing electrodes. Each set of DUT electrodes 108 or 109 can be operated in conjunction with either set of biasing electrodes 120 or 121. The determination of which set of electrodes to use, 108 or 109 is based on the sensitivity of the signal being tested on the DUT 110. For example, the electrodes 108 may be high sensitivity electrodes that are used when the signal from the DUT 110 begin tested has very low values, such as a relatively low voltage or low current level. Electrodes 109 may be low sensitivity electrodes that are used when the signal from the DUT 110 has relatively higher voltage or current values. The biasing electrodes 120 or 121 are chosen depending on which set of DUT electrodes are chosen. For example, the set of electrodes 120 may always be used when the DUT electrodes 108 are used, and likewise the set of electrodes 121 are used when the DUT electrodes 109 are used. However, it may be desirable to always use the higher sensitivity biasing electrodes 120 depending on the details of the construction of the biasing electronics. Note that that DUT electrodes 109 are further from the waveguide 112, as is the set of biasing electrodes 121. The other sets of electrodes 108, 120, are closer to the waveguide.

In operation, the optical transmitter 104 sends an unmodulated light beam to the electro-optical sensor 100. A user chooses which set of sensing electrodes, 108 or 109 to connect to the DUT depending on which signal is to be tested. After the operator couples the chosen DUT electrodes 108 or 109 to the sensor 100, unmodulated light from the optical transmitter 104 passes through the waveguide 112. The unmodulated light becomes modulated due to the applied electrical signal from the DUT 110 connected through the electrodes 108 or 109.

The modulated light is sent to an optical receiver 114 and converted to an electrical signal in an optical-to-electrical (O/E) converter 116. Then, the optical-to-electrical converter 116 sends the signal to a processor on a test and measurement instrument 118 for further processing or to be displayed on a display (not shown) of the test and measurement instrument 118 or to be stored in a memory (not shown) of the test and measurement instrument 118.

Figure 2:
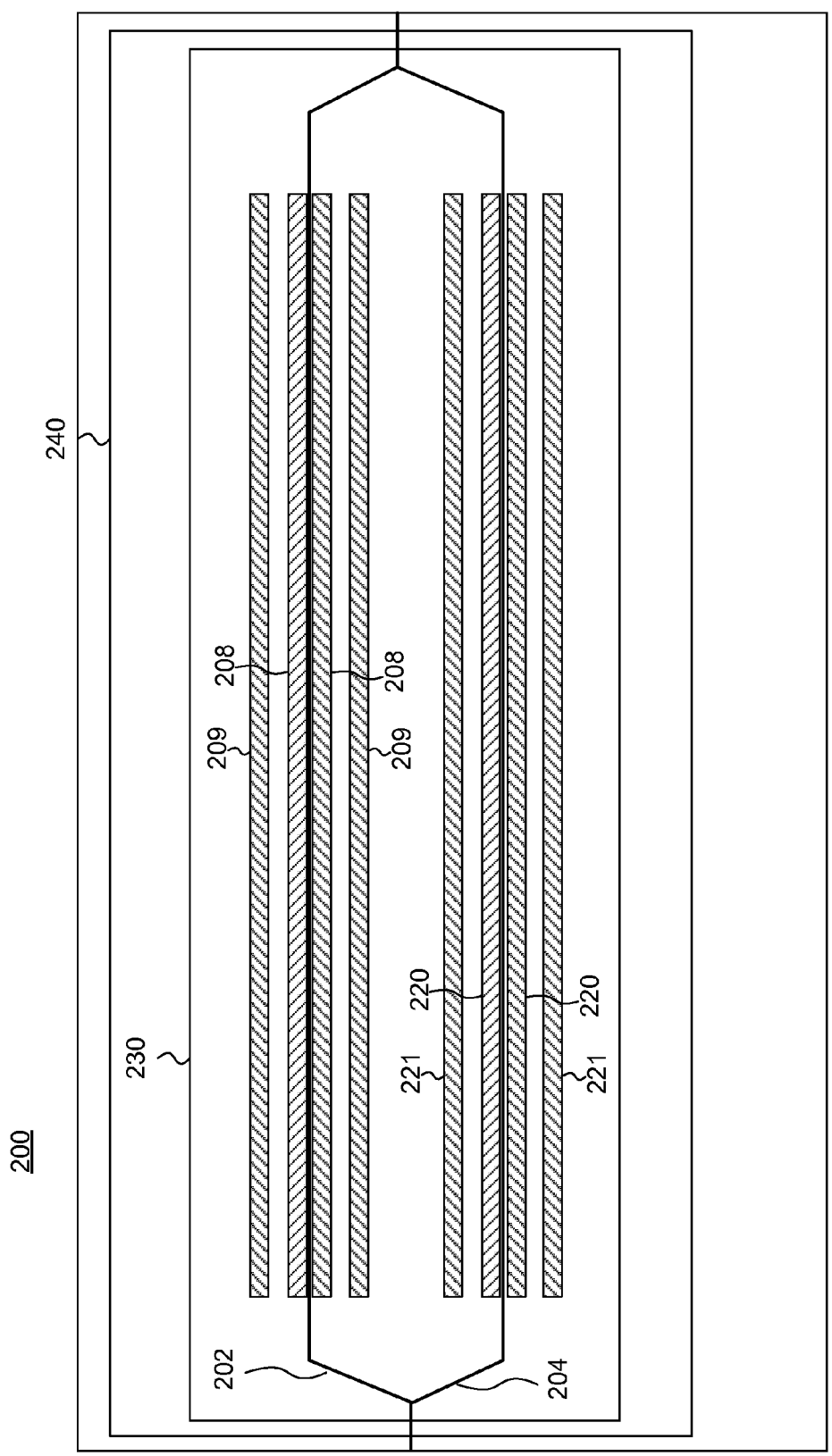
FIG. 2 illustrates an electro-optic modulator that includes electrodes having multiple sensitivities, according to embodiments of the invention.

FIG. 2 illustrates a multiple sensitivity electro-optic modulator 200 according to embodiments of the invention. In this electro-optic modulator 200, a waveguide in the Mach-Zehnder modulator includes two branches, 202, 204. The first branch 202 of the optical waveguide is surrounded by two sets of electrodes, 208 and 209, which may be embodiments of the electrodes 108 and 109, respectively, of FIG. 1. The electrodes 108 surround the first branch 202 at a closer distance than the electrodes 109, which are instead spaced further from the first branch 202. Likewise, the second branch 204 of the waveguide is surrounded by electrodes 220, 221, which may be embodiments of the electrodes 120, 121 illustrated in FIG. 1. The electrodes 108, 109, 120, 121 may be formed on or within a crystal substrate 230.

The electrodes 208 and 209 shown in FIG. 2 are driven differentially. An input signal comes into the structure 230 from both sides of the structure through damping resistors (not shown) to balance an impedance load of the set of electrodes 208 (or 209) to a guard 240. The set of electrodes 208 are long and may have terminated or unterminated ends. The set of electrodes 209 is similar, except they are disposed further from the first branch 202 of the waveguide. There is a trade-off between the electrode length, the sensitivity of the sensor and the frequency response. The input signal from the DUT (not illustrated in FIG. 2) is applied between the pair of electrodes 208 or the pair of electrodes 209 depending on the level of signal to be tested on the DUT. That is, the positive input from a device under test is connected to one of the electrodes of the set 208, 209, near the first branch 202 of the waveguide, while the negative input from the DUT is connected to the other electrode in the pair. Then, as outlined above, the signals from the DUT may be determined by evaluating the level or amount of phase change or modulation of the light passing through the waveguide in the crystal or polymer substrate.

Figure 3:
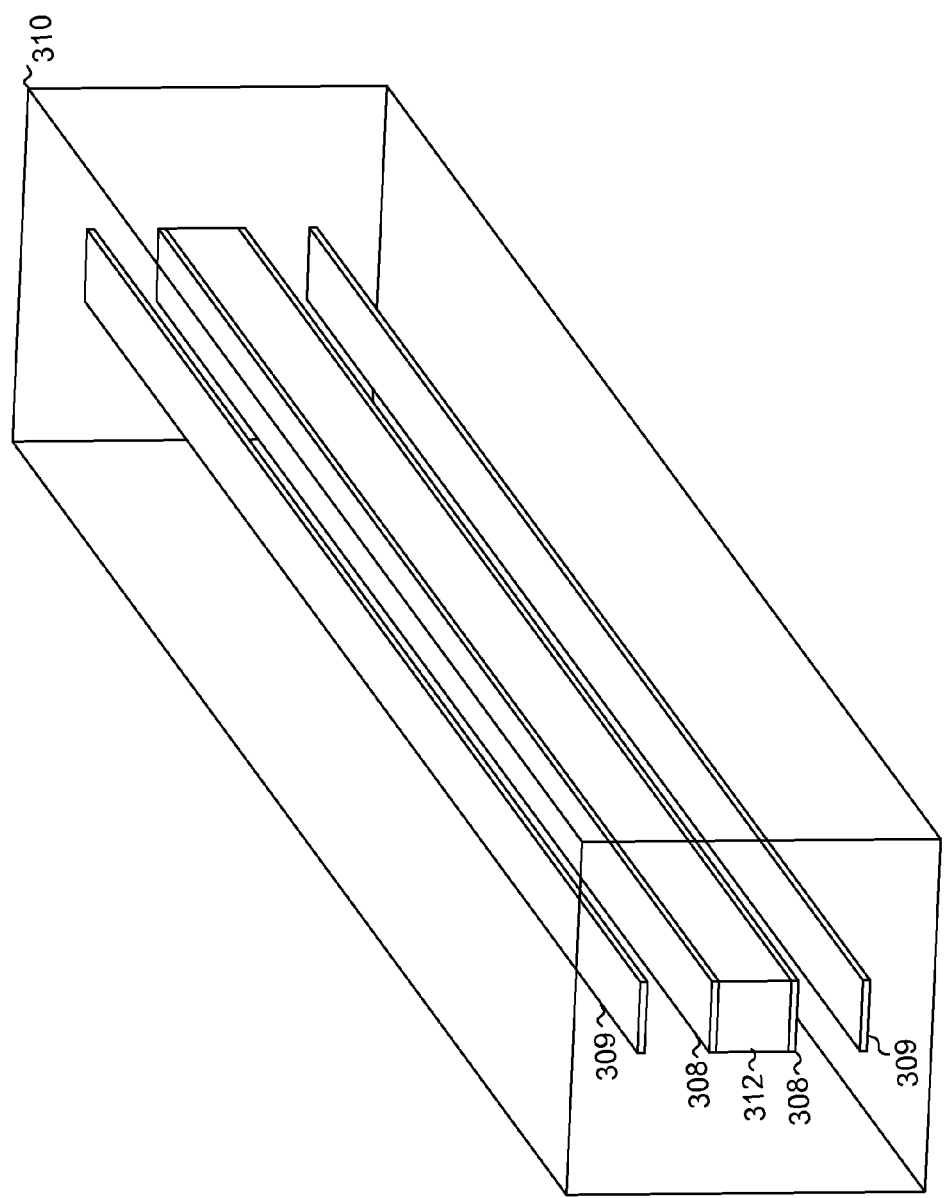
FIG. 3 illustrates another electro-optic modulator that includes electrodes having multiple sensitivities, according to embodiments of the invention.

FIG. 3 illustrates components 300 of another electro-optic modulator that includes electrodes having multiple sensitivities, according to embodiments of the invention. In this embodiment, a crystal or polymer 312 is configured to accept light from a light fiber cable (not illustrated) and carry it across the modulator to another light fiber cable (not illustrated) where the modulated light can then be sensed. A first pair of electrodes 308 is formed adjacent to the crystal or polymer 312, while a second pair of electrodes 309 is formed a further distance from the waveguide. A body 310 is formed of, for example, ceramic or plastic to physically contain all of the components 300. This embodiment differs from the one described with reference to FIG. 2 in that there are no biasing electrodes in this embodiment. The embodiment described with reference to FIG. 3 can be configured to modulate the phase or polarization state of the light passing through the waveguide 312, but, unlike the system described with reference to FIG. 2, does not modulate the amplitude of the light passing through it.

In operation, electrical signals from a DUT are coupled to either the electrode pairs 308 or 309, depending on the level of the signals to be tested. An electrical signal coupled to the electrodes 308 will have more of an impact on modulating the phase of the light as it passed through the crystal or polymer 312 than if the same signal were coupled to the electrodes 309. In this sense, the different sets of electrodes 308, 309 have different sensitivities. The user selects which sensitivity to use by which set of electrodes are coupled to the DUT.

The electro-optic modulator of the disclosed technology is preferably used in a test and measurement system. The test and measurement system includes a test and measurement instrument, a controller, an accessory head, and a device under test. The electro-optic modulator of the disclosed technology is typically located in the accessory head an optical sensor. During operation, a light beam is sent from an optical transmitter in the controller to the accessory head and the electro-optic modulator of the disclosed technology. The accessory head measures the signal from the device under test in response to the light beam through the electro-optic modulator. Then, the resulting light beam is sent back to an optical receiver of the controller and converted to an electrical signal to be stored in a memory of the test and measurement instrument or to be displayed on a display.

The test and measurement instrument may be an oscilloscope, logic analyzer, spectrum analyzer or similar such devices having an accessory device interface for accepting an accessory device.

The term "controller" and "processor" as used herein is intended to include microprocessors, microcomputers, ASICs, and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

Aspects of the invention include an electro-optical test component, comprising a crystal substrate structured to change its refractive index based on application of an electric field; an optical waveguide formed in the crystal substrate and configured to carry light from a first end of the crystal substrate and output a modulated output light signal at a second end of the waveguide, a first sensing electrode formed adjacent to the optical waveguide at a first distance therefrom, and a second sensing electrode formed adjacent to the optical waveguide at a second distance therefrom, the second distance being different than the first distance.

As mentioned above, applying a first signal from a device under test to the first sensing electrode causes the light to modulate at a first amplitude, while applying the first signal from the device under test to the second sensing electrode causes the light to modulate at a second amplitude. This allows the user to select which set of sensing electrodes to use based on the magnitude of the test signal. For example, the first set of sensing electrodes may be more sensitive, i.e., provide a higher relative output for the same input signal than the second set of sensing electrodes.

The optical guide may include, such as illustrated in FIG. 2, a first channel adjacent to which the first sensing electrode and second sensing electrode are formed, and a second channel. One or more biasing electrodes may be formed adjacent to the second channel, which may be formed of single or differential electrodes.

Other aspects of the invention include a test and measurement device. In such embodiments the test and measurement device includes an optical transmitter, an electro-optical test component coupled to the optical transmitter, an optical/electrical converter coupled to an output of the electro-optical test component, and a display structured to show a visual output based on the electric signal from the optical/electrical converter. The optical/electrical converter may be structured to generate an electric signal from an optical signal received from the crystal substrate of the electro-optical test component. The electro-optical test component of the test and measurement device may include a crystal substrate structured to change its refractive index based on application of an electric field, an optical waveguide formed in the crystal substrate and configured to carry light generated by the optical transmitter from a first end of the crystal substrate and configured to output a modulated output light signal at a second end of the waveguide, a first sensing electrode formed adjacent to the optical waveguide at a first distance therefrom, and a second sensing electrode formed adjacent to the optical waveguide at a second distance therefrom, the second distance being different than the first distance.

Other aspects of the invention include methods of using an electro-optical voltage accessory. One such method includes receiving at the electro-optical voltage accessory the variable input signal of the device under test, selecting the first sensing electrode or the second sensing electrode of the electro-optical voltage accessory, applying the variable input signal of the device under test to the selected sensing electrode, outputting from the electro-optical voltage accessory a modulated output signal based on the variable input signal, receiving the modulated output signal from the electro-optical voltage accessory at a processor, and modifying the modulated output signal from the electro-optical voltage accessory to reconstruct the variable input signal of the electro-optical voltage accessory. The variable input signal of the device under test may be applied differentially in some embodiments. In some embodiments a biasing signal is also applied. In some embodiments the variable input signal of the electro-optical voltage accessory is reconstructed on a display of the test and measurement instrument.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

What is claimed is:

1. An electro-optical probe for a test and measurement instrument, comprising:
   a substrate structured to change its refractive index based on application of an electric field;
   an optical waveguide formed in the substrate and configured to carry light from a first end of the substrate and output a modulated output light signal at a second end of the waveguide, the optical waveguide including a first channel;
   a first sensing electrode formed adjacent to the first channel of the optical waveguide at a first distance therefrom; and
   a second sensing electrode formed adjacent to the first channel of the optical waveguide at a second distance therefrom, the second distance being different than the first distance;
   wherein the first and second sensing electrodes are configured to be selectively coupled by a user to a device under test, and wherein the user selects which electrode to couple to the device under test based on a magnitude of an input signal from the device under test.

2. The electro-optical probe of claim 1, in which the first sensing electrode is a pair of differential electrodes, each of the pair formed at the first distance from the optical waveguide.

3. The electro-optical probe of claim 2, in which the second sensing electrode is a second pair of differential electrodes, each of the second pair formed at the second distance from the optical waveguide.

4. The electro-optical probe of claim 1, in which applying a first signal from a device under test to the first sensing electrode causes the light to modulate at a first amplitude, and in which applying the first signal from the device under test to the second sensing electrode causes the light to modulate at a second amplitude.

5. The electro-optical probe of claim 1, in which the optical guide includes a second channel.

6. The electro-optical probe of claim 5, further comprising:
   a first biasing electrode formed adjacent to the second channel of the optical waveguide at a third distance therefrom; and
   a second biasing electrode formed adjacent to the second channel of the optical waveguide at a fourth distance therefrom, the fourth distance being different than the third distance.

7. The electro-optical probe of claim 6, in which:
   the first biasing electrode is a first pair of differential electrodes, each of the first pair of biasing electrodes formed at the third distance from the second channel of the optical waveguide; and in which
   the second biasing electrode is a second pair of differential electrodes, each of the second pair of biasing differential electrodes formed at the fourth distance from the second channel of the optical waveguide.

8. The electro-optical probe of claim 7, in which the first distance is the same as the third distance, and in which the second distance is the same as the fourth distance.

9. The electro-optical probe of claim 1, in which the substrate is a crystal substrate.

10. The electro-optical probe of claim 1, in which the substrate is a polymer substrate.

11. A test and measurement device, comprising:
    an optical transmitter;
    an electro-optical sensor coupled to the optical transmitter, including:
        a substrate structured to change its refractive index based on application of an electric field,
        an optical waveguide formed in the substrate and configured to carry light generated by the optical transmitter from a first end of the substrate and configured to output a modulated output light signal at a second end of the waveguide, the optical waveguide including a first channel,
        a first sensing electrode formed adjacent to the first channel of the optical waveguide at a first distance therefrom, and
        a second sensing electrode formed adjacent to the first channel of the optical waveguide at a second distance therefrom, the second distance being different than the first distance,
        wherein the first and second sensing electrodes are configured to be selectively coupled by a user to a device under test, and wherein the user selects which electrode to couple to the device under test based on a magnitude of an input signal from the device under test;
    an optical/electrical converter coupled to an output of the electro-optical sensor and structured to generate an electric signal from an optical signal received from the substrate of the electro-optical sensor; and
    a display structured to show a visual output based on the electric signal from the optical/electrical converter.

12. The test and measurement device according to claim 11, in which the optical waveguide includes a second channel.

13. The test and measurement device according to claim 12, further comprising:
    a first biasing electrode formed adjacent to the second channel of the optical waveguide at a third distance therefrom; and
    a second biasing electrode formed adjacent to the second channel of the optical waveguide at a fourth distance therefrom, the fourth distance being different than the third distance.

14. A method for measuring a variable input signal of a device under test via an electro-optical voltage accessory connected to a test and measurement instrument, the electro-optical voltage accessory including an optical waveguide having a first sensing electrode disposed at a first distance from a first channel of the optical waveguide, and having a second sensing electrode disposed at a second distance from the first channel of the optical waveguide, the method comprising:
    receiving at the electro-optical voltage accessory the variable input signal of the device under test;
    selecting the first sensing electrode or the second sensing electrode of the electro-optical voltage accessory, the selection being made by a user of the electro-optical voltage accessory based on a magnitude of the variable input signal of the device under test;
    applying, by the user, the variable input signal of the device under test to the selected sensing electrode;
    outputting from the electro-optical voltage accessory a modulated output signal based on the variable input signal;
    receiving the modulated output signal from the electro-optical voltage accessory at a processor; and
    modifying the modulated output signal from the electro-optical voltage accessory to reconstruct the variable input signal of the electro-optical voltage accessory.

15. The method for measuring a variable input signal of a device under test according to claim 14 in which applying the variable input signal of the device under test to the selected sensing electrode comprises applying a differential signal to a pair of electrodes.

16. The method for measuring a variable input signal of a device under test according to claim 14, further comprising applying a biasing signal to a biasing electrode.

17. The method for measuring a variable input signal of a device under test according to claim 16, in which applying a biasing signal to a biasing electrode comprises:
    selecting either a first biasing electrode or a second biasing electrode as a selected biasing electrode; and
    applying the biasing signal to the selected biasing electrode.

18. The method for measuring a variable input signal of a device under test according to claim 14, in which the variable input signal of the electro-optical voltage accessory is reconstructed on a display of the test and measurement instrument.

19. The electro-optical probe of claim 1 in which:
    the first sensing electrode has a first sensitivity, and is coupled by a user to the device under test when the magnitude of the input signal from the device under test is within a first range, and the second sensing electrode has a second sensitivity, and is coupled by a user to the device under test when the magnitude of the input signal from the device under test is within a second range.

20. The electro-optical probe of claim 1, further comprising:
   a first input coupled to the first sensing electrode; and
   a second input coupled to the second sensing electrode,
   in which the user applies the input signal from the device under test to the first input when the input signal has relatively low values, and in which the user applies the input signal from the device under test to the second input when the input signal has relatively high values.

\* \* \* \* \*